United States Patent [19]

Turner, Jr.

[11] Patent Number: 4,704,573
[45] Date of Patent: Nov. 3, 1987

[54] IMPEDANCE MISMATCH DETECTOR

[75] Inventor: Harvey N. Turner, Jr., Raleigh, N.C.

[73] Assignee: Motorola, Inc., Schaumburg, Ill.

[21] Appl. No.: 801,181

[22] Filed: Nov. 22, 1985

[51] Int. Cl.$^4$ .................. G01R 27/04; H03H 7/38
[52] U.S. Cl. .................. 324/58 R; 324/57 R; 455/115; 333/32
[58] Field of Search .................. 324/57 R, 127, 58 R, 324/58 A, 58 B, 62; 455/123, 115, 129; 333/17 M, 32, 33, 35

[56] References Cited

U.S. PATENT DOCUMENTS

| | | | |
|---|---|---|---|
| 2,981,902 | 4/1961 | Familier | 333/17 M |
| 3,249,863 | 5/1966 | Wright | 324/58 B |
| 3,683,274 | 8/1972 | Martin | 324/58 R |
| 3,870,957 | 3/1975 | Straw | 455/115 X |
| 4,262,246 | 4/1981 | Fujii | 324/58 R |
| 4,373,581 | 2/1983 | Toellner | 333/17 M X |
| 4,493,112 | 1/1985 | Bruene | 455/123 |
| 4,506,209 | 3/1985 | Landt | 324/58 B X |

OTHER PUBLICATIONS

Johnk, Engineering Electromagnetic Fields and Waves, Copyright 1975 pp. 391–396.
"The Radio Amateur's Handbook," 1982 Edition, American Radio Relay League, pp 16–32.
"IEEE Transactions on Microwave Theory and Techniques," vol. MTT-30, No. 4, Apr. 1982, p. 660.

Primary Examiner—Reinhard J. Eisenzopf
Assistant Examiner—Jack B. Harvey
Attorney, Agent, or Firm—Mark P. Kahler; Joseph T. Downey; Anthony J. Sarli, Jr.

[57] ABSTRACT

A mismatch detector is provided for determining whether or not a particular load impedance is matched or mismatched to the characteristic impedance of a transmission line. The detector is capable of determining if a particular load impedance has a value outside of an impedance threshold circle having a center at a location other than at the center of the Smith Chart. This flexibility enables the detector to be more selective in determining improper load conditions.

2 Claims, 7 Drawing Figures

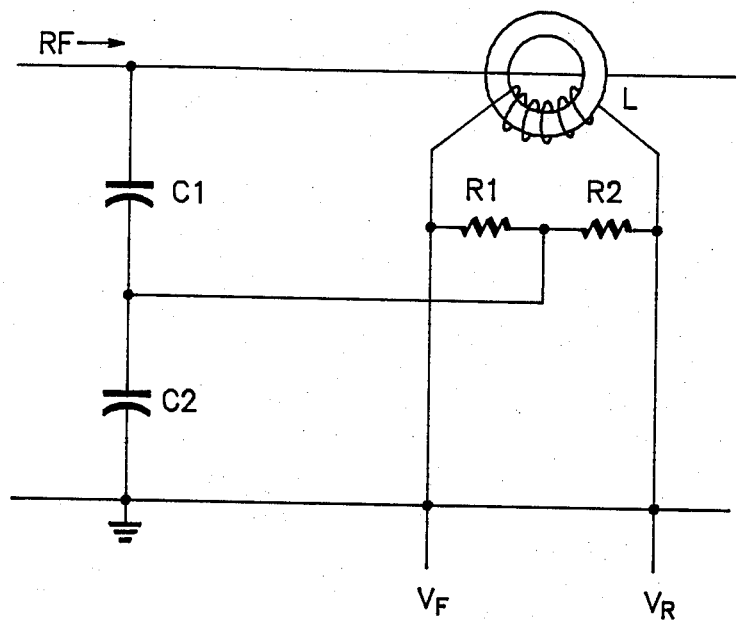
FIG. 1 —PRIOR ART—
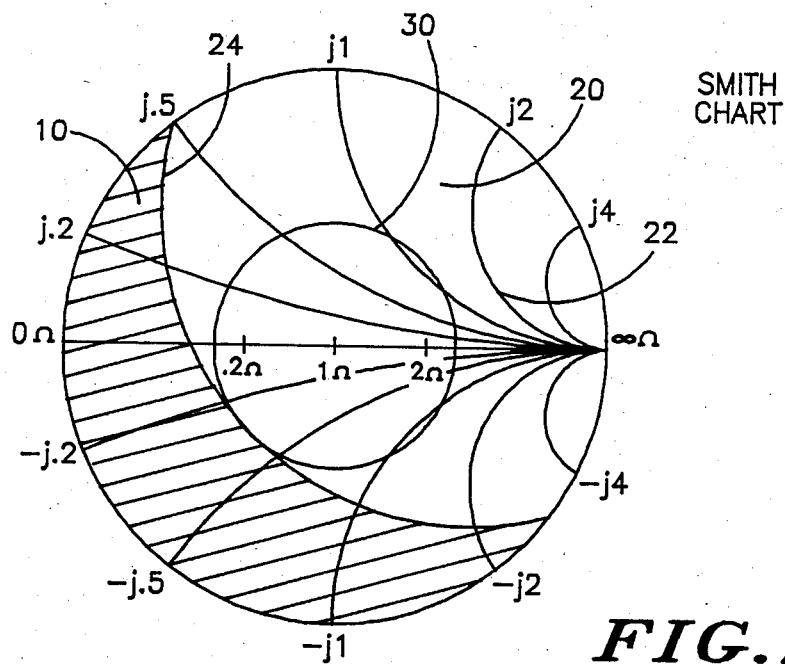
FIG. 2

IMPEDANCE MISMATCH DETECTOR

BACKGROUND OF THE INVENTION

This invention relates to detectors for detecting impedance mismatches between transmission lines and load impedances. More particularly, the invention relates to a detector which is capable of processing not only reflection coefficient magnitude information but also reflection coefficient phase information as a basis for determining the existence of a mismatch.

In radio electronics, it is often helpful to know whether a transmission line is matched or mismatched to a load impedance. A directional coupler circuit such as that shown in FIG. 1 may be used to make this determination. This example of a directional coupler is one of the components in the Antenna Tuner Discriminator of U.S. Pat. No. 4,493,112 issued to Warren B. Bruene on Jan. 8, 1985. The elements of this coupler circuit are selected such that when the RF transmission line through the coupler is terminated in a proper load impedance, for example 50 ohms, the voltage drop across resistor R1 is equal to and in phase with the voltage across capacitor C2 of the voltage divider C1-C2. When properly terminated as above, the forward voltage, $V_f$, is a positive value. At the same time, the voltage drop across resistor R2 is equal to but opposite in phase with the voltage drop across capacitor C2. Since the termination is proper, there will be no reflected voltage wave. In other words, the voltage of the reflected wave, $V_r$, will have a magnitude of zero. However when the impedance of the load is not the proper termination resistance, 50 ohms in the example, a reflected voltage wave will be generated. Thus, $V_r$ will have a non-zero magnitude. In the present example, the resistances of resistors R1 and R2 are equal and substantially less than the impedance of inductor L.

Those skilled in the art appreciate that the above directional coupler can be used as a detector which determines when a load impedance is mismatched to a transmission line. The extent of the mismatch is indicated by the magnitude of the reflected voltage wave, $V_r$. As the mismatch becomes larger, the reflected voltage wave becomes larger and, correspondingly, the voltage standing wave ratio (VSWR) becomes larger.

As already mentioned, the above discussed directional coupler can be used to indicate when a mismatched load impedance is present. However, it does not give any information about the specific nature of the load impedance, that is, whether it is capacitive, inductive or resistive or a combination thereof. Stated alternatively, the directional coupler of FIG. 1 gives no phase information about the impedance under test.

Turning now to FIG. 2, a Smith Chart representing load impedance is shown. In general, this Smith Chart represents all impedances which the load impedance could possibly assume. Those skilled in the art use Smith Charts to plot load impedances in a manner which indicates the extent to which such impedances are resistive, capacitive, inductive, or combinations thereof.

It is noted that load impedances in specific ranges are most likely to cause oscillation in a given RF power amplifier. The Smith Chart of FIG. 2 includes a cross-hatched region 10 which is defined to be one such region of instability for purposes of this example. That is, region 10 of the Smith Chart represents a range of different values of load impedance which would cause an amplifier coupled to such impedance to become unstable. Portions of the Smith Chart generally above and to the right of region 10 form a region 20 which represents load impedances resulting in stable amplifier operation. An seen in FIG. 2, region 20 is generally circular in shape and includes a center 22. The edge of region 20 which is bounded by unstable region 10 is referred to as threshold circle 24 because circle 24 represents the threshold between stable and unstable amplifier operation. Center 22 is also referred to as the threshold center.

Prior to the detector of the invention, mismatch detectors could determine whether or not a particular load impedance was inside or outside of a threshold circle centered at the Smith Chart origin, such as threshold circle 30 (discussed later). However, such conventional detectors did not address the problem of determining whether or not a load impedance is inside or outside a threshold circle centered at a point on the Smith Chart other than at the origin, such as threshold circle 24.

It will be recalled that the directional coupler discussed above merely determines the magnitude of the reflected voltage signal resulting from a particular load impedance. The coupler can thus be used to determine if a particular load impedance results in a VSWR which exceeds a predetermined value. In other words, the coupler is used to determine whether or not a given load impedance is inside or outside of a threshold circle centered at the origin such as the 2.5 to 1 VSWR threshold circle 30. The center or origin of the Smith Chart represents a perfectly matched load. As we move away from the center of the Smith Chart in any direction, the extent of the mismatch and the magnitude of the VSWR increase. By way of example, all the points on the threshold circle 30 represent different mismatched load impedances which would cause a VSWR of 2.5 to 1. It is noted that the 2.5 to 1 VSWR threshold circle 30 is tangent to the cross-hatched region of instability 10. It is again noted that any mismatch will result in some VSWR, however many impedance mismatches may not cause instability problems. In many situations, only a certain range of load impedances, such as cross-hatched region 10, will cause instability. As pointed out in the subsequent discussion, a conventional directional coupler detector circuit is of limited application under these circumstances because it can not determine whether or not a certain impedance lies within or without a threshold circle having a center other than at the center of the Smith Chart.

With respect to FIG. 2, it is noted that the cross-hatched region of instability 10 is tangent to circle 30. Further, note that circle 30 is centered at the Smith Chart origin. Assume now that the directional coupler of FIG. 1 is used to detect when the load impedance becomes so high or low that such load impedance is not within circle 30. Stated alternatively, such directional coupler is used to determine when the load impedance causes a predetermined VSWR (eg. 2.5 to 1) to be exceeded. The occurrence of this condition can be used to trigger appropriate amplifier stabilization circuitry. For a circuit which is capable of achieving stabilization in this manner, see U.S. Pat. No. 4,439,741 entitled Stabilized High Efficiency Radio Frequency Amplifier, issued to Harvey N. Turner, Jr. on Mar. 27, 1984 and assigned to Motorola, Inc., the assignee of the invention described herein. The disclosure of U.S. Pat. No. 4,439,741 is incorporated herein by reference.

By examining the Smith Chart of FIG. 2, it is clear that if the directional coupler of FIG. 1 were used as the mismatch detector, stabilization circuitry would have to be activated at every point outside of threshold circle 30 to insure amplifier protection in the cross-hatched region of instability 10 tangent thereto. In some applications, such an arrangement may be undesirable and inefficient because the stabilization circuitry, which consumes power, would be activated for many load impedance values where it is really not necessary, namely those load impedance values outside of the cross hatched region of instability 10 and not within circle 30. This problem is encountered because prior mismatch detectors were limited to determining whether or not a particular load impedance was within or without a threshold circle centered at the origin of the Smith Chart. In contrast to prior mismatch detectors, the present invention is directed to detecting the presence of load impedances within a range of values outside a threshold circle having a center on the Smith Chart which may be other than the normalized origin of the Smith Chart.

One impedance mismatch detection system which employs the impedance mismatch detector of the present invention is described and claimed in the copending United States patent application entitled Adaptive Impedance Mismatch Detector System, Ser. No. (to be assigned), filed (to be assigned), such application having the same inventor and assignee as the present invention.

The features of the invention believed to be novel are specifically set forth in the appended claims. However, the invention itself, both as to structure and method of operation, may best be understood by reference to the following description considered together with the accompanying drawings.

BRIEF SUMMARY OF THE INVENTION

One object of the present invention is to provide an impedance mismatch detector capable of detecting whether or not a particular impedance has an impedance value outside of a threshold circle centered at a point on a Smith Chart which may be other than at the center or origin of the Smith Chart.

Another object of the invention is to provide an impedance mismatch detector which corrects the deficiencies of other mismatch detectors discussed above.

In one embodiment of the invention, a mismatch detector is provided for detecting an impedance mismatch between first and second impedance exhibiting circuits coupled thereto. The mismatch detector includes an impedance analyzing circuit for determining if the impedance of the first impedance circuit is within or without a selected Smith Chart threshold circle which has a center at a location on the Smith Chart other than at the origin of such chart. In this manner, the presence of an impedance mismatch is detected.

In another embodiment of the invention, the mismatch detector circuit detects an impedance mismatch between a transmission line and a load impedance. The transmission line includes first and second conductors. A first transformer includes first and second windings, the first winding of which is coupled in parallel with the transmission line. One end of the second winding is coupled to the second conductor. A second transformer includes first and second windings, the first winding of which is coupled to the first conductor of the transmission line. A load impedance is coupled between a remaining end of the first winding of the first transformer and the second conductor of said transmission line. The detector further includes first and second impedance elements, each having opposed ends. One end of the first impedance element is coupled to one end of the second impedance element. The remaining end of the first impedance element is designated node V1 which is coupled to one end of the second winding of the second transformer. The remaining end of the second impedance element is designated node V2 which is coupled to the remaining end of the second winding of the second transformer. The impedances of the first and second impedance elements are selected such that the detector exhibits a Smith Chart threshold circle having a center at a location other than the origin of the Smith Chart. When the detector is driven by a radio frequency signal provided to the transmission line, the voltages present at nodes V1 and V2 indicate whether the impedance exhibited by the load impedance is within or without the Smith Chart threshold circle having a center at a location other than at the origin of the Smith Chart.

BRIEF DESCRIPTION OF THE DRAWINGS

FIG. 1 is a schematic diagram of a directional coupler.

FIG. 2 is a Smith Chart graph showing ranges of load impedance which a conventional directional coupler can detect and ranges of impedance which are detectable by the present inveniton.

DETAILED DESCRIPTION OF THE INVENTION

Figure 3:
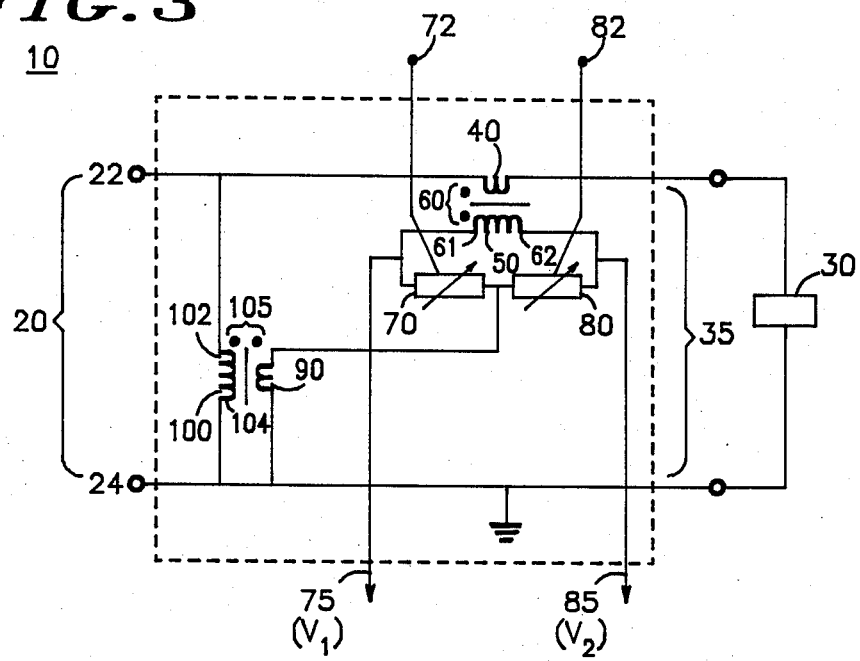
FIG. 3 is a schematic diagram of one embodiment of the detector of the invention.

Turning now to FIG. 3, one embodiment of the mismatch detector of the invention is shown as detector 10. Detector 10 is used to detect the presence of an impedance mismatch between a transmission line or other apparatus connected to a port 20, formed by nodes 22 and 24, and a load impedance 30, coupled to a detector output port 35 as shown. Node 24 is coupled to ground. Node 22 is coupled to load impedance 30 by an inductor 40. The remaining end of impedance 30 is coupled to ground. In this particular embodiment, inductor 40 is fabricated by a conductive wire passing through the center of a toroid 50. Together, inductor 40 and toroid 50 form a toroidal transformer 60 of which inductor 40 is the primary winding and toroid 50 is the secondary winding. At very high frequencies (VHF), an inductance of 1.5 uH was found to be a satisfactory value of inductance for toroid inductor 50. The secondary winding 50 of toroidal transformer 60 includes two ends which are designated ends 61 and 62. Winding end 61 is coupled to one end of a variable impedance element 70. Winding end 62 is coupled to one end of a variable impedance element 80. As shown in FIG. 3, the remaining ends of impedance elements 70 and 80 are coupled together. Variable impedance elements 70 and 80 include control terminals 72 and 82, respectively. Appropriate control signals, discussed later, are supplied to control terminals 72 and 82 to select the particular impedance desired for impedance elements 70 and 80, respectively. The node formed between winding end 61 and impedance element 70 is designated node 75 at which a voltage V1 is measured. The node between winding end 62 and impedance element 80 is designated node 85 at which a voltage V2 is measured.

The common connection between impedance elements 70 and 80 is coupled to ground via an inductor 90. Inductor 90 is fabricated by a conductive wire passing through the center of a toroid inductor 100. Together, inductor 90 and toroid 100 form a toroidal transformer 105 in which toroid 100 is the primary winding and inductor 90 is the secondary winding. The primary winding 100 of such toroidal transformer 105 includes winding ends 102 and 104. Winding end 102 is coupled to node 22 at the input of mismatch detector 10. The remaining winding end 104 is coupled to ground as shown. Toroidal transformer 105 is substantially the same as transformer 60.

When port 20 is driven with RF energy, the ratio $|V2/V1|$ gives an indication of whether or not the load impedance 30 is within or without the threshold circle 24. The discussion below explains in more detail how this impedance mismatch determination is made.

It is noted that toroidal transformer 60 is formed by inductors 40 and 50 which exhibit inductances designated $L_{40}$ and $L_{50}$, respectively, for purposes of the equations and relationships presented below. The coupling coefficient between inductors 40 and 50 is designated $k_{60}$. Toroidal transformer 105 is formed by inductors 90 and 100 which exhibit inductances designated $L_{90}$ and $L_{100}$, respectively. The coupling coefficient between inductors 40 and 50 is labelled $k_{105}$. Provided that impedance elements 70 and 80 and transformers 60 and 105 meet the following conditions:

(1) $L_{50}=L_{100}$
(2) $L_{40}=L_{90}$
(3) $k_{60}=k_{105}$
(4) $|Z_{70}|>>wL_{40}(1-k_{60}^2)$
(5) $|Z_{80}|>>wL_{40}(1-k_{60}^2)$
(6) $|Z_{70}+Z_{80}|<<wL_{50}$ then, $$\left|\frac{V_2}{V_1}\right| \doteq \left|\frac{Z_{30}-Z_{80}}{Z_{30}+Z_{70}}\right| \doteq T \quad (7)$$

where $Z_{30}$ is the impedance exhibited by load impedance 30. For convenience, $Z_{30}$ is also referred to as $Z_L$.

It is further noted that if (8) $Z_{70}=Z_{80}=Z_O$ where $Z_O$ is the characteristic impedance of the transmissions lines coupled to the impedance mismatch detector 10, then equation (7) becomes $$\left|\frac{V_2}{V_1}\right| \doteq \left|\frac{Z_L-Z_O}{Z_L+Z_O}\right| \doteq \rho \quad (9)$$

which is the expression for the magnitude of the reflection coefficient, $\rho$ (rho).

Now expressing impedance in normalized form, that is,

(10) $z=Z/Z_O$ one obtains,

(11) $z_{70}=r_{70}+jx_{70}$
(12) $z_{80}=r_{80}+jx_{80}$

The $\rho$ plane (Smith Chart) threshold circles represented by the normalized version of equation 7 are found to be circles with centers $(u_o,v_o)$ and radii P, such that:

$$u_o = \frac{1-r_o^2-x_o^2+R_o^2}{1+r_o^2+2r_o+x_o^2-R_o^2} \quad (13)$$

$$v_o = \frac{2x_o}{1+r_o^2+2r_o+x_o^2-R_o^2} \quad (14)$$

$$P = 2R_o/(1+r_o^2+2r_o+x_o^2-R_o^2) \quad (15)$$

$$\rho = u+jv \quad (16)$$

$$r_o = -\left(\frac{T^2 r_{70}+r_{80}}{T^2-1}\right) \quad (17)$$

$$x_o = -\left(\frac{T^2 x_{70}+x_{80}}{T^2-1}\right) \quad (18)$$

$$R_o^2 = \left(\frac{T}{T^2-1}\right)^2 [(r_{70}+r_{80})^2+(x_{70}+x_{80})^2] \quad (19)$$

Further substituting,
(20) $z_{70}=1+j0$
it can be shown that, $$v_o = \frac{2x_{80}}{(1+r_{80})^2+x_{80}^2} \quad (21)$$

$$u_o = \frac{r_{80}^2+x_{80}^2-1}{(1+r_{80})^2+x_{80}^2} \quad (22)$$

$$P = \frac{2T}{\sqrt{(1+r_{80})^2+x_{80}^2}} \quad (23)$$

Those skilled in the use of Smith Charts will recognize that equation 21 and equation 22 are expressions for impedance coordinates on the Smith Chart. Thus, for the case where $z_{70}=1+j0$, the center of the threshold circle is at $r_{80}+jx_{80}$ as plotted on the Smith Chart.

In accordance with the invention, the following discussion details the selection of the various detector circuit parameters necessary to achieve a threshold circle 24, for example, as shown in FIG. 2. Select the normalized impedance of variable impedance element 70 as follows:

(24) $z_{70}=1+j0$

Then plot the center point of the desired threshold circle on the Smith Chart as in FIG. 2. In this example, the center is designated as center 22 and is located at $1+j2$. To achieve a threshold circle with this desired center, the impedance $z_{80}$ of impedance element 80 is selected to be equal to that center value, namely $1+j2$ in this example. It is noted that:

(25) $z_{80} = r_{80} + j\,x_{80}$

Also note that rewriting equation 23, the threshold or trigger ratio, T, is given by:

$$T = \frac{P}{2}\sqrt{(1 + r_{80})^2 + x_{80}^2} \qquad (26)$$

where P is the desired radius of the threshold circle.

The trigger ratio, T, is defined to be the ratio of $|V_2|$ to $|V_1|$ needed to achieve a particular threshold circle of selected radius. For example, as in FIG. 2, wherein $z_{80} = 1 + j2$ and $P = 1.15$, then the trigger ratio T is equal to 1.6 as per equation 26. With respect to threshold circle 24 and the crosshatched region 10 outside of such circle, if the ratio of $|V_2|$ to $|V_1|$ is less than T, then the load impedance 30 has an impedance value within the threshold circle 24. Expressed alternatively, whenever the magnitude value of $V_2$ is less than 1.6 times the magnitude value of $V_1$, the load impedance 30 is located within threshold circle 24 of the Smith Chart. Conversely, if the ratio of $|V_2|$ to $|V_1|$ is greater than T, then the load impedance 30 has an impedance value outside of the threshold circle 24, thus indicating an undesired impedance value. Expressed alternatively, whenever the magnitude value of $V_2$ exceeds 1.6 times the magnitude value of $V_1$, the load impedance 30 is within the crosshatched region 10 of the Smith Chart. It is thus seen that the ratio of the $|V_1|$ and $|V_2|$ output voltages of mismatch detector 10 includes indicia of the impedance of impedance element 30, that is, whether such impedance is inside or outside of threshold circle 24.

Figure 4:
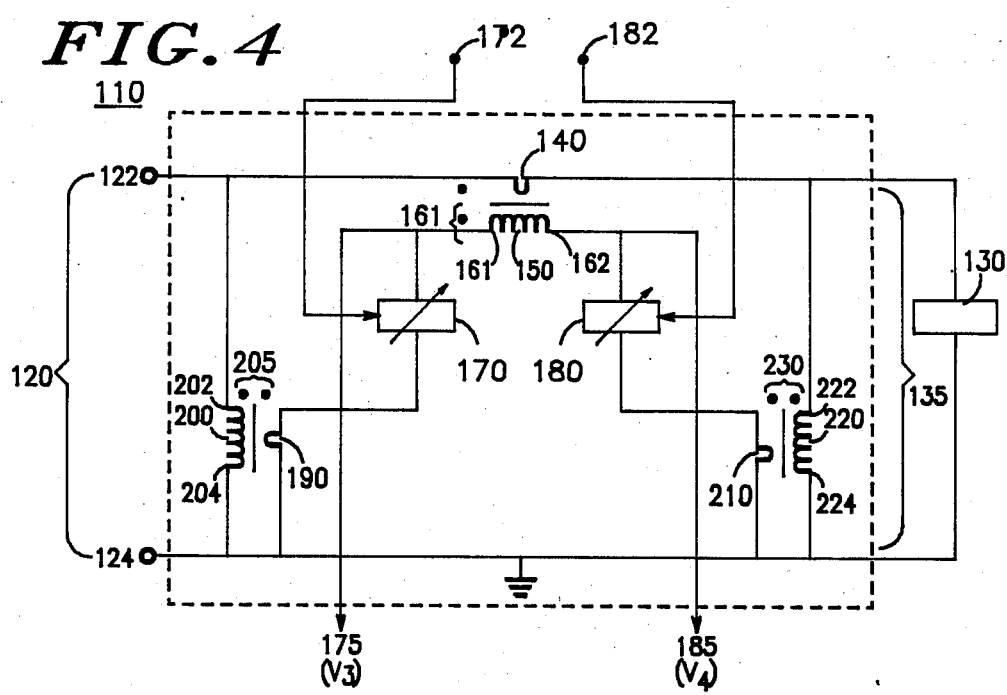
FIG. 4 is a schematic diagram of another embodiment of the detector of the invention.

FIG. 4 shows another embodiment of the mismatch detector of the invention as detector 110. Detector 110 is used to detect the presence of an impedance mismatch between a transmission line or other apparatus connected to a port 120, formed by nodes 122 and 124, and a load impedance 130 coupled to a detector output port 135 as shown. Node 124 is coupled to ground. Node 122 is coupled to load impedance 130 by an inductor 140 as shown in FIG. 4. The remaining end of impedance 130 is coupled to ground. In this particular embodiment, inductor 140 is fabricated by a conductive wire passing through the center of a toroid inductor 150. Together inductor 140 and toroid 150 form a toroidal transformer 160 of which inductor 140 is the primary winding and toroid 150 is the secondary winding. For use at very high frequencies (VHF), an inductance of 1.5 uH was found to be a satisfactory value of inductance for toroid inductor 150. The secondary winding 150 of toroidal transformer 160 includes two ends which are designated ends 161 and 162. Winding end 161 is coupled to one end of a variable impedance element 170. The node thus formed between winding end 161 and impedance element 170 is designated node 175, the voltage at which is designated V3. Winding end 162 is coupled to one end of a variable impedance element 180. The node thus formed between winding end 162 and impedance element 180 is designated node 185, the voltage at which is designated V4.

The remaining end of impedance element 170 is coupled to ground via an inductor 190. Inductor 190 is fabricated by a conductive wire passing through the center of a toroid inductor 200. Together, inductor 190 and toroid 200 form a toroidal transformer 205 in which toroid 200 is the primary winding and inductor 190 is the secondary winding. For VHF purposes, an inductance of 1.5 uH was found to be a satisfactory value of inductance for primary winding 200. The primary winding 200 of such toroidal transformer 205 includes winding ends 202 and 204. Winding end 202 is coupled to node 122 at the input of mismatch detector 110. The remaining winding end 204 is coupled to ground as shown.

The remaining end of impedance element 180 is coupled to ground by an inductor 210. Inductor 210 is fabricated by a conductive wire passing through the center of a toroid inductor 220. Together, inductor 210 and inductor 220 form a toroidal transformer 230 in which inductor 210 is the primary winding and toroid 220 is the secondary winding. For VHF purposes, an inductance of 1.5 uH was found to be a suitable value of inductance for toroidal inductor 220. The secondary winding of toroidal transformer 230 includes winding ends 222 and 224. Winding end 222 is coupled to inductor 140 and to one end of impedance element 130 as shown in FIG. 3. Winding end 224 is coupled to ground and to the remaining end of impedance element 130.

When port 120 is driven with RF energy, the ratio $|V_4|/|V_3|$ gives an indication of whether or not the load impedance 130 is within or without the threshold circle 24.

The mismatch detector embodiment 110 of FIG. 4 is obtained from the detector embodiment 10 of FIG. 3 by transformation such that

(27) $|V_3| = |V_4|$ when the impedance of load impedance 130 of FIG. 4 is situated on threshold circle 24 of FIG. 2. The magnitudes of radio frequency (RF) voltages $V_3$ and $V_4$, as in equation 26, are conveniently obtained by using non-ideal diodes as envelope detectors to process the $V_3$ and $V_4$ voltages. By causing the desired threshold to occur when $|V_3| = |V_4|$, dependence on the absolute level of $V_3$ and $V_4$ is removed.

The component values of detector 110 are labeled as follows for convenience in subsequent discussion. Inductors 140 and 150 of transformer 160 exhibit inductances of $L_{140}$ and $L_{150}$, respectively, and are coupled together by mutual inductance $M_{160}$. Inductors 190 and 200 of transformer 205 exhibit inductances of $L_{190}$ and $L_{200}$, respectively, and are coupled together by mutual inductance $M_{190}$. Inductors 210 and 220 of transformer 230 exhibit inductances of $L_{210}$ and $L_{220}$, respectively, and are coupled together by mutual inductance $M_{230}$.2 Then, $$\left|\frac{V_4}{V_3}\right| = p_o \left|\frac{Z_{130} - p_2 Z_{180}}{Z_{130} + p_1 Z_{170}}\right| \qquad (28)$$

where $$p_1 = \frac{M_{160}}{M_{205}} \cdot \frac{L_{200}}{L_{150}} \qquad (29)$$

$$p_2 = \frac{M_{160}}{M_{230}} \cdot \frac{L_{220}}{L_{150}} \qquad (30)$$

$$p_o = \frac{M_{230}}{M_{205}} \cdot \frac{L_{200}}{L_{220}} = \frac{p_1}{p_2} \qquad (31)$$

It will be recalled from the discussion of the detector 10 embodiment of FIG. 3 as depicted in the Smith Chart of FIG. 2, that $T = 1.6$, $z_{70} = 1 + j0$, and $z_{80} = 1 + j2$. That example is now transformed to the detector 110 embodiment. Whereas in the detector 10 embodiment, $$\left|\frac{V_2}{V_1}\right| = 1.6, \tag{32}$$

at threshold,
it is now desired that, $$\left|\frac{V_4}{V_1}\right| = 1, \tag{33}$$

at threshold.
Setting $p_0 = 1/1.6$, $p_1 = 1$, $p_2 = 1.6$, and $$Z_{170} = 1 + j0 \text{ and,} \tag{34}$$

$$Z_{160} = \frac{1}{1.6} + j\frac{2}{1.6} = 0.625 + j1.25 \tag{35}$$

then, we have $$\left|\frac{V_4}{V_3}\right| = \frac{1}{1.6}\left|\frac{Z_{130} - (1 + j2)}{Z_{130} + 1}\right|. \tag{36}$$

Thus when load impedance 130 is on circle 24, then, $$\left|\frac{V_4}{V_3}\right| = 1 \tag{37}$$

And, when $$|V_4| > |V_3| \tag{38}$$

the load impedance $Z_{130}$ is situated within the crosshatched region 24 of FIG. 2. Note that the threshold center on the Smith Chart is still at $1+j2$ even though we have used a normalized impedance of $z_{180} = 0.625 + j1.25$.

From the expressions for $p_1$ and $p_2$, we obtain the relationship of the three toroidal transformers 160, 205 and 230. Since $p_1 = 1$, transformers 160 and 205 are identical. When the following expressions relating self inductance and coupling coefficient to mutual inductance:

$$M_{160} = k_{160}\sqrt{L_{140}L_{150}} \tag{39}$$

$$M_{230} = k_{230}\sqrt{L_{210}L_{220}} \tag{40}$$

are substituted into the expression for $p_2$, then the following design relationship $$p_2 = \frac{k_{160}}{k_{230}}\sqrt{\frac{L_{140}}{L_{210}}}\sqrt{\frac{L_{220}}{L_{150}}} \tag{41}$$

is obtained. For the example under consideration, $p_2 = 1.6$. If $L_{140} = 10$ nH and $L_{210} = 3.9$ nH while the other transformer parameters are held equal, then the desired results, previously described are obtained.

To summarize, the output voltages $V_4$ and $V_3$ of mismatch detector 110 provide indicia of the impedance of impedance element 130, that is, whether such impedance is inside or outside of threshold circle 24. If the ratio of $|V_4|$ to $|V_3|$ is less than T (recall that in this example T=1), then impedance element 130 has an impedance value within the threshold circle 24. In other words, whenever the magnitude value of $V_4$ is less than 1.0 times the magnitude value of $V_3$, the impedance of impedance element 130 is within threshold circle 24 of the Smith Chart. Conversely, if the ratio of $|V_4|$ to $|V_3|$ is greater than T, then the load impedance 30 has an impedance value outside of the threshold circle 24, thus indicating an undesired impedance value. In other words, whenever the magnitude value of $V_4$ exceeds 1.0 times the magnitude value of $V_3$, then the impedance of impedance element 130 is outside the threshold circle 24 and within the crosshatched region 10 of the Smith Chart.

Figure 5:
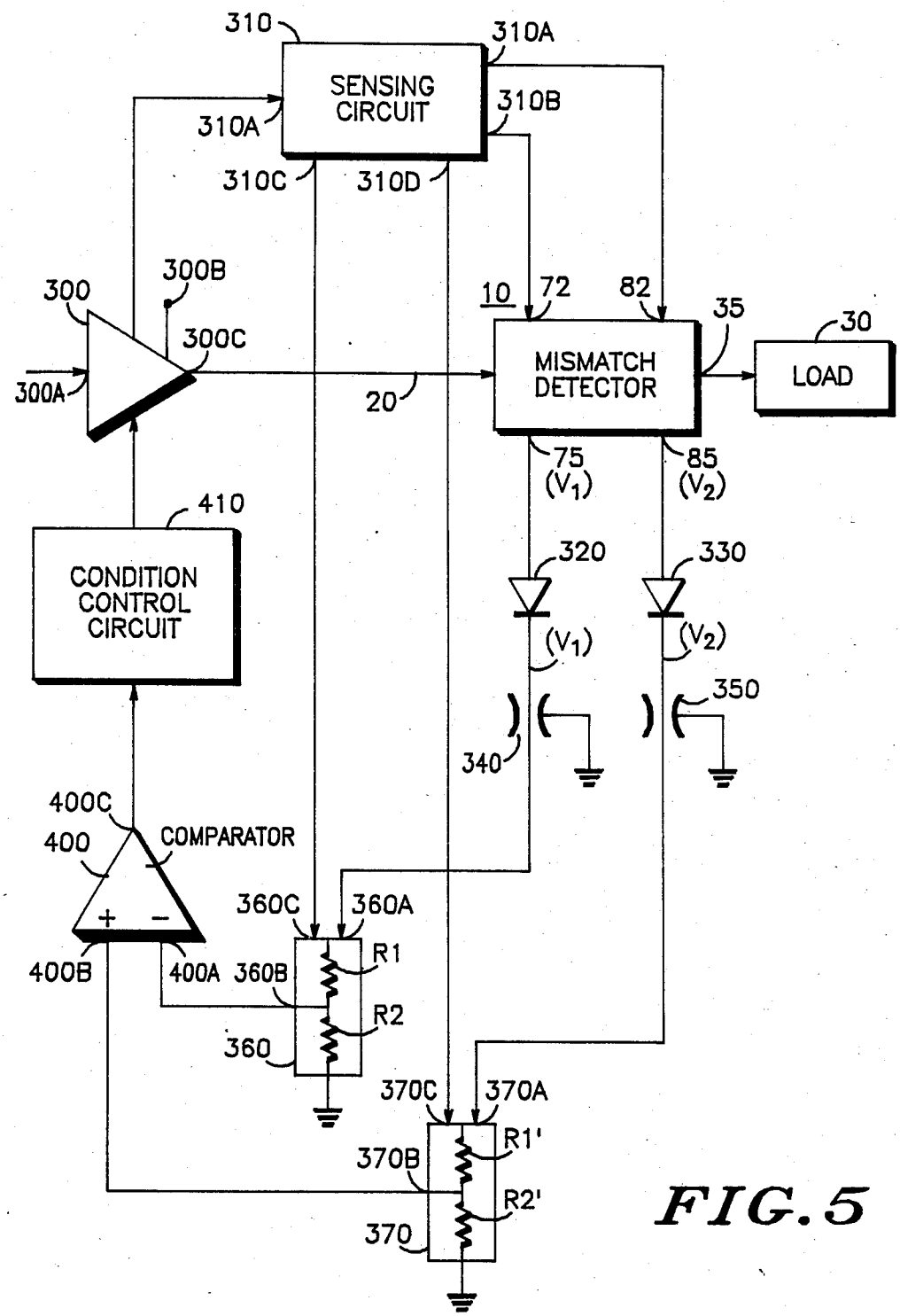
FIG. 5 is a block diagram of an adaptive impedance mismatch detector system employing the impedance mismatch detector of FIG. 3.

FIG. 5 shows an adaptive mismatch detector system employing the mismatch detector 10 of FIG. 3. Those skilled in the art will appreciate that the detector 110 of FIG. 4 can also be employed as the mismatch detector in the mismatch detector system of FIG. 5. Thus, the detector system of FIG. 5 has some elements in common with the detector circuit of FIG. 3, like numerals indicating like components. The detector system includes a radio frequency amplifier 300 having an input 300A to which a radio frequency signal is applied for amplification. An appropriate power supply voltage is coupled to the voltage supply input 300B. The amplified radio frequency signal thus produced at amplifier output 300C is coupled to the input port 20 of mismatch detector 10. For purposes of this example, 50 ohm transmission lines are used to couple together amplifier 300, detector 10 and impedance 30 (discussed later).

An impedance element 30, for example, a load impedance, is coupled to the output port 35 of mismatch detector 10 as shown. The impedance of this impedance element 30 is tested by mismatch detector 10 to determine whether such impedance is inside or outside of a selected threshold circle. The mismatch detection system of FIG. 5 has the capability of varying the location and radius of the Smith Chart threshold circle as a function of changing circuit conditions and parameters as discussed subsequently. This is a highly desirable feature for a mismatch detection system because under some operating conditions a particular impedance value for impedance element 30 may cause no problems in circuit operation, whereas under other operating conditions (e.g. increased temperature, supply voltage, current or drive levels, or change of frequency of operation, for example), the same impedance value may produce undesired effects in associated circuitry coupled thereto.

The detector system includes a sensing circuit 310 having a sensing input 310A which is capable of sensing changing operating conditions and parameters in circuitry coupled to mismatch detector 10 or remote from detector 10. In the embodiment shown in FIG. 5, sensing circuit 310 is coupled to amplifier 300 in a manner enabling it to sense the operating temperature of amplifier 300. Those skilled in the art will appreciate that a thermocouple (not shown) or similar device is conveniently used to provide sensing circuit 310 with such temperature information. Sensing circuit 310 includes sensing outputs 310A and 310B which are coupled to mismatch detector control terminals 72 and 82, respectively. The control signals thus supplied to mismatch detector 10 determine the values of impedance which variable impedance elements 70 and 80 within detector 10 exhibit. It will be recalled that the impedance values of impedance elements 70 and 80 determine the center of the threshold circle exhibited by detector 10. It is thus seen that, in this embodiment of the invention, the position of the threshold circle on the Smith Chart is controlled by the temperature of amplifier 300. More specifically, the temperature information sensed by sensing circuit 310 results in control signals at control terminals 72 and 82 which select the impedance values of impedance elements 70 and 80, respectively, thus determining the center of the threshold circle.

The invention is not limited to sensing temperature and controlling the position of a Smith Chart threshold circle in response thereto. The sensing of the temperature operating condition is given merely by way of example. Those skilled in the art will appreciate that sensing circuit 310 is employed to sense other operating conditions and circuit parameters such as the RF drive level supplied to amplifier input 300A, power supply voltage supplied to amplifier 300, current consumed by amplifier 300 or other devices, the frequency of operation of amplifier 300, the temperature of load 30, and so forth. In this manner, changes in such operating conditions and parameters are used to determine the center of the Smith Chart threshold circle by changing the values of impedance elements 70 and 80 in response thereto. Two examples of such threshold circle center control including Smith Chart representations are discussed later.

It will be recalled that nodes 75 and 85 are the locations in mismatch detector 10 at which voltages $V_1$ and $V_2$, respectively, are measured. Further recall that the ratio of voltages $V_1$ and $V_2$ gives information as to whether the impedance of impedance element 30 is within or without the selected Smith Chart threshold circle. Nodes 75 and 85 are coupled to envelope detectors 320 and 330, respectively. Diodes are conveniently employed as such envelope detectors. Since envelope detectors 320 and 330 detect the envelopes of the $V_1$ and $V_2$ RF signals provided thereto, the output signals of envelope detectors 320 and 330 are the absolute values or magnitudes of the input signals, namely, the absolute value of $V_1$ ($|V_1|$) and the absolute value of $V_2$ ($|V_2|$), respectively as shown in FIG. 5.

The outputs of envelope detectors 320 and 330 are coupled to ground by bypassing capacitors 340 and 350, respectively. The output of envelope detector 320 is coupled to the input 360A of an electronically actuable voltage divider 360. The output 360B of voltage divider 360 is coupled to the negative terminal 400A of a comparator 400. In this embodiment, comparator 400 is configured to turn on when impedance 30 is outside of the selected Smith Chart threshold circle. The extent of the voltage division or reduction provided by voltage divider 400 is determined by a control signal provided to the control terminal 360° C. One convenient way to view voltage divider 400 is to consider a potentiometer-like mechanical version thereof wherein resistive portions R1 and R2 are designated as shown in FIG. 5 and the values of R1 and R2 are determined by the position of a wiper which corresponds to output 360B.

An output terminal 370B of a second voltage divider circuit 370, substantially the same as voltage divider circuit 360, is coupled to the positive terminal 400A of comparator 400. Input 370A, output 370B, control terminal 370C, resistive portions R1' and R2' of voltage divider 370 correspond to input 360A, output 360B, control terminal 360C, and resistive portions R1 and R2, respectively. Voltage divider input terminal 370A is coupled to the output of envelope detector 330.

In summary, voltage divider 360 and 370 provide for reducing the voltage levels of the $|V_1|$ and $|V_2|$ signals to the extent desired prior to application of such signals to the inputs 400A and 400B of comparator 400. It is again recalled that the ratio of the V1 and V2 signals carries information as to whether impedance 30 is inside or outside of the selected threshold circle. Changing the values of the resistive portions (R1, R2, R1' and R2') results in changes in the radius of the selected Smith Chart threshold circle. This occurs because the point at which comparator 400 triggers on is altered by such changes.

It was noted earlier that sensing circuit 310 senses the temperature of amplifier 300, or other operating conditions and parameters in other embodiments of the invention. Sensing circuit 310 includes outputs 310C and 310D which are coupled to control terminals 360C and 370C, respectively. In response to the sensed temperature or other operating condition or other parameter, sensing circuit 310 generates control signals at outputs 310C and 310D which instruct voltage dividers 360 and 370, respectively, to what extent the $|V_1|$ and $|V_2|$ voltages are to be divided or reduced prior to application to the inputs of comparator 400. In this manner, the radius of the selected threshold circle is made to vary with sensed temperature or other parameter. Keeping in mind that the radius of the threshold circle is capable of varying with selected operating conditions or other parameters, it is noted that the output 400C of the comparator 400 turns on whenever the impedance of impedance element 30 is indicated to be outside of the threshold circle defined by its present radius and center. Undesired impedance mismatch is thus indicated.

The output 400C of comparator 400 is coupled to the input of a condition control circuit 410 which is turned on when output 400C goes high. In this embodiment, condition control circuit 410 is coupled to amplifier 300. One condition control circuit which may be used as control circuit 410 is the stabilization circuit described in the above incorporated U.S. Pat. No. 4,439,741. In such case, whenever comparator output 400C goes high, an undesired mismatch is indicated and stabilization circuitry is turned on for the duration of the mismatch to stabilize amplifier 300. The invention also contemplates using other condition control circuits for control circuit 410. For example, in one embodiment of the invention, condition control circuit 410 is a cooling device which is activated by comparator output 400C going high during an undesired impedance mismatch. Such cooling device acts to cool amplifier 300 or other associated circuitry for the duration of the mismatch. Moreover, known voltage and current protection circuits are also conveniently used as condition control circuit 410 to protect amplifier 300 or other devices from undesirable high voltage and current levels during periods of undesired impedance mismatch. As mentioned above, condition control circuit 410 need not be coupled to amplifier 300. Condition control circuit 410 is conveniently coupled to other circuitry either associated with or remote from detector 10, to control an operating condition or conditions, a parameter or parameters of such other circuitry. For example, in one embodiment, condition control circuit 410 is an electronically variable tuning circuit which is coupled to the impedance 30 under test. When impedance 30 exhibits a value outside of the threshold circle 24 (as indicated by comparator output 300C going high), such electronically variable tuning circuit couples an appropriate amount of inductive or capacitive reactance to impedance 30 to make the combined impedance of such elements be within threshold circle 24 (as indicated by comparator output 300C going low). That is, such electronically variable tuning circuit tunes until comparator output 300C goes low. Those skilled in the art will appreciate that other condition control circuits can be used in addition to those briefly listed and discussed above.

Two examples are now described in which the mismatch detection system exhibits different Smith Chart threshold circles with different centers and radii. In this way, it will be shown how the mismatch detection system exhibits a first threshold circle in response to predetermined operating conditions or parameters and then, in response to different operating conditions or parameters, exhibits a second threshold circle.

Assume for purposes of this first example that sensing circuit 310 of FIG. 5 is a temperature sensing circuit which senses the operating temperature of amplifier 300. Further, assume that when amplifier 300 is operating at normal temperature, for example, 40 degrees Celsius, that we desire the mismatch detector system to employ a Smith Chart threshold circle 420 having a center 430 at $1+j2$ and a radius P of 1.15, as measured on the reflection coordinate scale of the Smith Chart. These center and radius values are conveniently plotted on the Smith Chart of FIG. 6. To cause the impedance mismatch detection system to employ such a threshold circle 420, sensing circuit 310 generates appropriate control signals at outputs 310A and 320B to instruct variable impedances 70 and 80 ($z_{70}$ and $z_{80}$), to exhibit impedances of $1+j0$ and $1+j2$, respectively. Substituting these values into the trigger ratio equation (26), it is seen that the trigger ratio $T=1.6$. Thus to achieve the desired threshold circle 420 described above, comparator 400 must trigger on when $|V2|=1.6|V1|$. For this to occur, the resistive portions of voltage dividers 360 and 370 are appropriately adjusted such that in divider 360 there is no dividing action. Thus, the full voltage $|V1|$ reaches comparator input 400A and in divider 370, $R_2'/(R_1'+R_2')=1/1.6$. Thus, by such voltage dividing action, when $|V2|=1.6|V1|$, the voltages supplied to comparator inputs 400A and 400B will be equal, which causes comparator 400 to turn on. Of course, the above adjustment of the resistive portions of dividers 360 and 370 may be performed manually if desired. However, in the embodiment shown in FIG. 5, in response to sensed operating conditions (e.g. a temperature of 40 degrees Celsius), sensing circuit 310 generates appropriate control signals at outputs 310C and 310D to cause the resistive portions of voltage dividers 360 and 370 to assume the resistance values necessary to cause the impedance mismatch system to exhibit the threshold circle 420 having a radius deemed proper for such operating conditions.

Thus, the impedance under test for mismatch, namely impedance 30, exhibits an acceptable impedance if such impedance is inside the above described threshold circle 420 however, if by action of comparator 400, impedance 30 is found not to be within such threshold circle, then condition control circuit 410 is turned on to change a selected operating condition of amplifier 300, for example to stabilize amplifier 300 as previously discussed.

Figure 6:
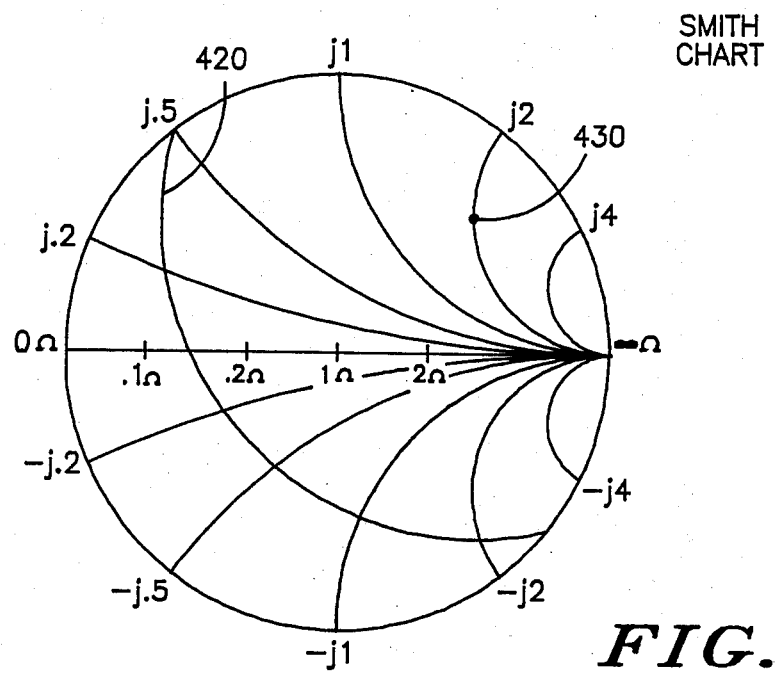
FIG. 6 is a Smith Chart showing a first threshold circle with a predetermined center and radius which is employed by the mismatch detector system.
Figure 7:
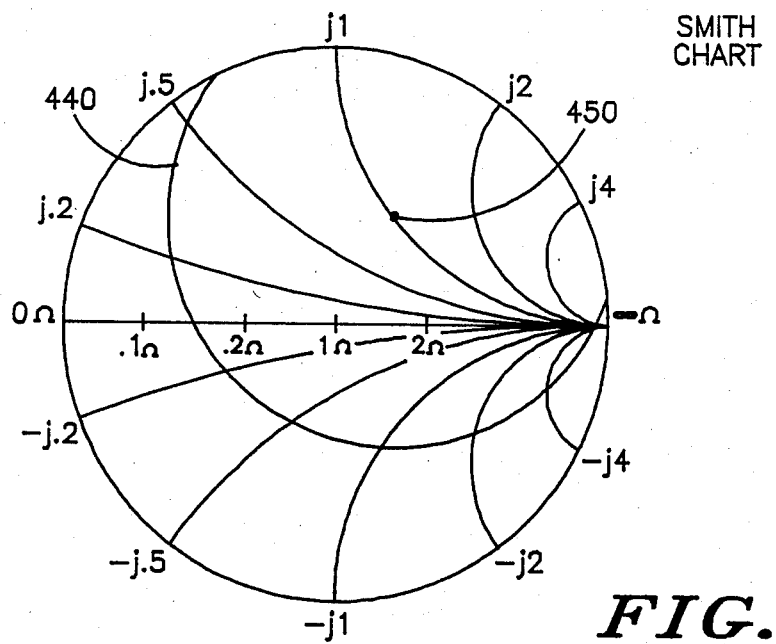
FIG. 7 is a Smith Chart showing a second threshold circle with a different predetermined center and radius than the threshold circle of FIG. 6.

Now assume that the temperature operating condition of amplifier 300 increases such that the first threshold circle 420 shown in FIG. 6 is no longer appropriate. For example, when the amplifier temperature increases to an elevated temperature, for example 75 degrees Celsius, load impedance values of impedance 30 which previously caused no stability problem now tend to cause amplifier 300 to become unstable. A second Smith Chart threshold circle 440 seen in FIG. 7 with a smaller radius and a different center 450 than threshold circle 420 is now appropriate. Threshold circle 440 has a center 450 situated at $1+j1$ and a radius of 0.8 as measured on the reflection coefficient scale on the Smith Chart.

To cause the impedance mismatch detection system to employ such a threshold circle 440, sensing circuit 310 generates appropriate control signals at outputs 310A and 320B to instruct variable impedances 70 and 80 ($z_{70}$ and $z_{80}$), to exhibit impedances of $1j0$ and $1+j1$, respectively. By substituting these values into the trigger ratio equation (26), it is seen that the trigger ratio $T=0.89$. Thus to achieve the desired threshold circle 440 described above, comparator 400 must trigger on when $|V2|=0.89|V1|$. For this to occur, the resistive portions of voltage dividers 360 and 370 are appropriately adjusted such that in divider 360, $R_2/(R_1+R_2)=0.89$. and divider 370 performs no dividing action, such that the full voltage $|V1|$ reaches comparator input 400B. Thus, by such voltage dividing action, when $|V2|=0.89|V1|$, the voltages supplied to comparator inputs 400A and 400B will be equal, which causes comparator 400 to turn on. The above adjustment of the resistive portions of dividers 360 and 370 may be performed manually if desired. However, in the embodiment shown in FIG. 5, in response to the changed sensed operating conditions (e.g. the now elevated temperature of 75 degrees Celsius), sensing circuit 310 generates appropriate control signals at outputs 310C and 310D to cause the resistive portions of voltage dividers 360 and 370 to assume values such that $R_2/(R_1+R_2)=0.89$. Thus, the mismatch detection system now employs the threshold circle 440 shown in FIG. 7.

It is seen that in the elevated temperature case (FIG. 7) just discussed that both the threshold circle center was changed and the threshold circle radius was reduced as compared with the prior case (FIG. 6). As a result, fewer impedance values are acceptable for the impedance under test for mismatch, namely impedance 30. Correspondingly, fewer values of impedance fall within the new threshold circle 440. This is appropriate since at elevated temperatures, in this example, the stability of amplifier 300 becomes more critical such that more values of load impedances 30 will result in potential stability problems. Of course, other amplifiers may exhibit instability problems at low temperatures. Those skilled in the art will appreciate that the invention is conveniently modified to accomodate such circumstances.

Although, thus far the impedance values outside of the threshold circle were designated as being the unacceptable values, this is merely a matter of convention. Situations are conceivable wherein impedance values within the threshold circle are acceptable and those impedance values outside the threshold circle are unacceptable.

The foregoing describes an impedance mismatch detector and an adaptive impedance mismatch detector system which employs such detector. The detector advantageously detects whether or not a particular impedance has a value outside of an threshold circle centered at a point on a Smith Chart which may be other than at the center or origin of the Smith Chart. When employed in conjunction with the above described mismatch detector system, the detector operates in an adaptive manner, that is, it is capable of detecting different selected ranges of mismatched load impedances when appropriately instructed as described above.

While only certain preferred features of the invention have been shown by way of illustration, many modifications and changes will occur to those skilled in the art. It is, therefore, to be understood that the present claims are intended to cover all such modifications and changes which fall within the true spirit of the invention.

I claim:

1. A mismatch detector circuit for detecting an impedance mismatch between a transmission line and a first impedance exhibiting circuit comprising:
   a transmission line having a characteristic impedance and including first and second conductors;
   a first transformer having first and second windings, said first winding being coupled in parallel with said transmission line, one end of said second winding being coupled to the second conductor;
   a second transformer having first and second windings, one end of the first winding of said second transformer being coupled to the first conductor of said transmission line;
   the first impedance exhibiting circuit coupled between a remaining end of the first winding of said second transformer and the second conductor of said transmission line,
   first and second impedance means, each having opposed ends, one end of each of said first and second impedance means being coupled together, the remaining end of said first impedance means being designated node V1 and which is coupled to the one end of the second winding of said second transformer, the remaining end of said second impedance means being designated node V2 and which is coupled to the remaining end of the second winding of said second transformer;
   the impedance values of said first and second impedance means being selected such that said detector exhibits a Smith Chart threshold circle having a center at a location on the Smith Chart other than at the origin thereof,
   the voltages present at nodes V1 and V2, when said detector is driven with radio frequency energy, indicating whether the impedance exhibited by said first impedance exhibiting circuit is within or without said Smith Chart threshold circle,
   whereby the presence of an impedance mismatch is detected when the impedance of said first impedance exhibiting circuit is without said Smith Chart threshold circle.

2. A mismatch detector circuit for detecting an impedance mismatch between a transmission line and a first impedance exhibiting circuit comprising:
   a transmission line having a characteristic impedance and including first and second conductors;
   a first transformer, having first and second windings, said first winding being coupled in parallel with said transmission line, one end of said second winding being coupled to said second conductor,
   a second transformer, having first and second windings, said first winding having first and second ends of which one end is coupled to said first conductor;
   a third transformer, having first and second windings, one end of each of the first and second windings of said third transformer being coupled to said second conductor, a remaining end of the second winding of said third transformer being coupled to a remaining end of the first winding of said second transformer;
   a first impedance means coupled between one end, designated node V3, of the second winding of said second transformer and a remaining end of the second winding of said first transformer;
   a second impedance means coupled between a remaining end, designated node V4, of the second winding of said second transformer and a remaining end of the first winding of said third transformer;
   the first impedance exhibiting circuit being coupled between a remaining end of the first winding of the second transformer and said second conductor,
   the impedance values of said first and second impedance means being selected such that said detector exhibits a Smith Chart threshold circle having a center at a location on the Smith Chart other than at the origin thereof,
   the voltages present at nodes V3 and V4, when said detector is driven with radio frequency energy, indicating whether the impedance exhibited by said first impedance exhibiting circuit is within or without said Smith Chart threshold circle,
   whereby the presence of an impedance mismatch is detected when the impedance of said first impedance exhibiting circuit is without said Smith Chart threshold circle.

* * * * *